United States Patent
Park et al.

(10) Patent No.: US 9,112,114 B2
(45) Date of Patent: Aug. 18, 2015

(54) LIGHT EMITTING DEVICE WITH METAL ELECTRODE LAYER HAVING PROTRUSION PORTIONS

(71) Applicant: LG INNOTEK CO., LTD., Seoul (KR)

(72) Inventors: BumDoo Park, Seoul (KR); TaeJin Kim, Seoul (KR); MinSuk Kim, Seoul (KR); YeongUn Seong, Seoul (KR); SangJun Lee, Seoul (KR); TaeYong Lee, Seoul (KR); KiYong Hong, Seoul (KR); SonKyo Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/167,833

(22) Filed: Jan. 29, 2014

(65) Prior Publication Data

US 2014/0209960 A1    Jul. 31, 2014

(30) Foreign Application Priority Data

Jan. 30, 2013  (KR) .................. 10-2013-0010621
Jun. 3, 2013   (KR) .................. 10-2013-0063614

(51) Int. Cl.

| H01L 33/00 | (2010.01) |
|---|---|
| H01L 21/00 | (2006.01) |
| H01L 33/38 | (2010.01) |
| H01L 33/42 | (2010.01) |
| H01L 33/60 | (2010.01) |
| H01L 33/40 | (2010.01) |
| H01L 51/52 | (2006.01) |

(52) U.S. Cl.
CPC .............. *H01L 33/387* (2013.01); *H01L 33/38* (2013.01); *H01L 33/40* (2013.01); *H01L 33/405* (2013.01); *H01L 33/42* (2013.01); *H01L 33/60* (2013.01); *H01L 51/5203* (2013.01); *H01L 2924/01004* (2013.01); *H01L 2924/12041* (2013.01)

(58) Field of Classification Search
CPC ....... H01L 33/387; H01L 33/62; H01L 33/42; H01L 33/405; H01L 27/156; H01L 2924/01004; H01L 2924/12041; H01L 33/38; H01L 33/60; H01L 51/5203
See application file for complete search history.

(56) References Cited

U.S. PATENT DOCUMENTS

| 8,421,112 B2 * | 4/2013 | Jeong et al. ................. 257/99 |
| 8,643,040 B2 * | 2/2014 | Lee et al. .................... 257/98 |
| 8,766,287 B2 * | 7/2014 | Moon et al. .................. 257/88 |
| 2011/0024776 A1 * | 2/2011 | Kim et al. ................... 257/94 |
| 2011/0227109 A1 * | 9/2011 | Kim et al. ................... 257/98 |
| 2012/0032218 A1 * | 2/2012 | Choi et al. .................. 257/98 |
| 2012/0104444 A1 * | 5/2012 | Hwang et al. ................ 257/98 |

(Continued)

*Primary Examiner* — Alonzo Chambliss
(74) *Attorney, Agent, or Firm* — Birch, Stewart, Kolasch & Birch, LLP

(57) ABSTRACT

Disclosed is a light emitting device including a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, and a second electrode layer electrically connected to the second semiconductor layer, wherein the first electrode layer includes a metal electrode layer disposed on the conductive substrate, a transparent electrode layer disposed on the metal electrode layer, and a plurality of contact portions extending from the metal electrode layer, the contact portions vertically passing through the transparent electrode layer and contacting the light emitting structure, wherein the contact portions are spaced from one another by a predetermined distance.

20 Claims, 10 Drawing Sheets

(56) References Cited

U.S. PATENT DOCUMENTS

| | | |
|---|---|---|
| 2012/0138969 A1* | 6/2012 | Moon et al. .................... 257/88 |
| 2012/0235168 A1* | 9/2012 | Katsuno et al. ................ 257/88 |
| 2012/0256210 A1* | 10/2012 | Moon et al. .................... 257/94 |
| 2013/0113007 A1* | 5/2013 | Choi .............................. 257/98 |
| 2013/0285095 A1* | 10/2013 | Moon ............................. 257/98 |
| 2014/0145233 A1* | 5/2014 | Lee et al. ....................... 257/98 |

* cited by examiner

LIGHT EMITTING DEVICE WITH METAL ELECTRODE LAYER HAVING PROTRUSION PORTIONS

CROSS-REFERENCE TO RELATED APPLICATION

This application claims the priority benefit of Korean Patent Application No. 10-2013-0010621, filed on Jan. 30, 2013, and No. 10-2013-0063614, filed on Jun. 3, 2013 in the Korean Intellectual Property Office, the disclosure of which is incorporated herein by reference.

BACKGROUND

1. Field

Embodiments relate to a light emitting device.

2. Description of the Related Art

A light emitting diode (LED) as a representative example of a light emitting device is a device which converts electrical signals into infrared light, visible light or light using characteristics of compound semiconductors. LED's are now being applied to devices such as home appliances, remote controls, electronic signboards, displays, a variety of automatic appliances and the like and applications thereof continue to expand.

Generally, a miniaturized LED is fabricated as a surface mount device so as to be directly mounted to a printed circuit board (PCB). Accordingly, an LED lamp used as a display device is also developed into a surface mount device. Such a surface mount device may replace conventional simple luminaires and is used as lighting displays, character displays, image displays and the like, rendering various colors.

As the application range of LEDs extends, luminance required for lights for daily use and lights for distress signals increases. Accordingly, it is important to increase luminance of LEDs.

In addition, electrodes of light emitting devices should have superior adhesion and electrical properties.

In addition, research to improve luminance of light emitting devices and reduce operating voltage is underway.

SUMMARY

Embodiments provide a light emitting device which reduces forward voltage (VF) and improves luminous efficacy.

In one embodiment, a light emitting device includes a conductive substrate, a first electrode layer disposed on the conductive substrate, a light emitting structure disposed on the first electrode layer, the light emitting structure including a first semiconductor layer, a second semiconductor layer, and an active layer disposed between the first semiconductor layer and the second semiconductor layer, and a second electrode layer electrically connected to the second semiconductor layer, wherein the first electrode layer includes a metal electrode layer disposed on the conductive substrate, a transparent electrode layer disposed on the metal electrode layer, and a plurality of contact portions extending from the metal electrode layer, the contact portions vertically passing through the transparent electrode layer and contacting the light emitting structure, wherein the contact portions are spaced from one another by a predetermined distance.

A diffusion area containing Be may be formed in a portion of the light emitting structure contacting the contact portion.

A planar area of the transparent electrode layer may be greater than a planar area of the contact portion.

A material for the metal electrode layer may be the same as a material for the contact portion.

The light emitting structure may further include a window layer contacting the first electrode layer.

The contact portion may contact a lower surface of the window layer.

The diffusion area may be formed in the light emitting structure using a mixture of Be and at least part of elements of a material constituting the light emitting structure.

The diffusion area may protrude from the light emitting structure.

The contact portion may include AuBe, Ag or a Ag alloy.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
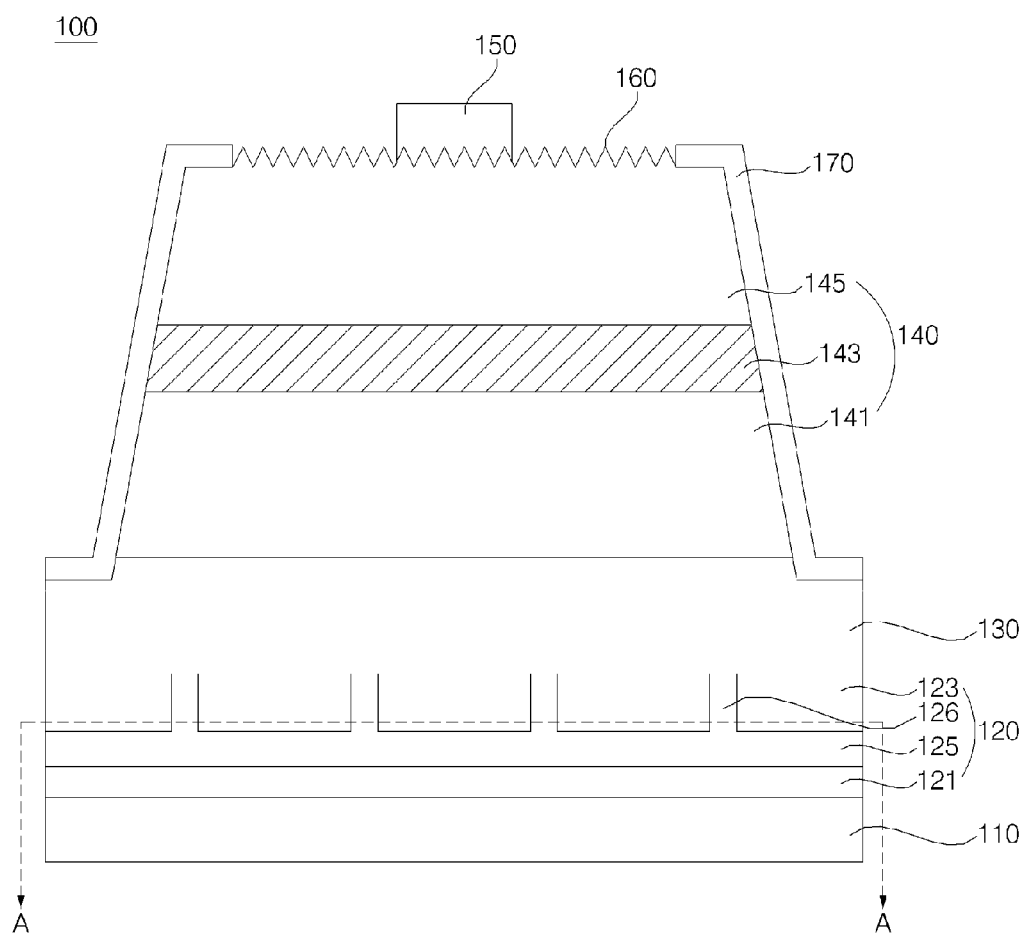
FIG. 1 is a sectional view illustrating a light emitting device according to an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially relative terms such as "below", "beneath", "lower", "above", or "upper" may be used herein to describe one element's relationship to another element as illustrated in the figures. It will be understood that spatially relative terms are intended to encompass different orientations of the device in addition to the orientation depicted in the figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
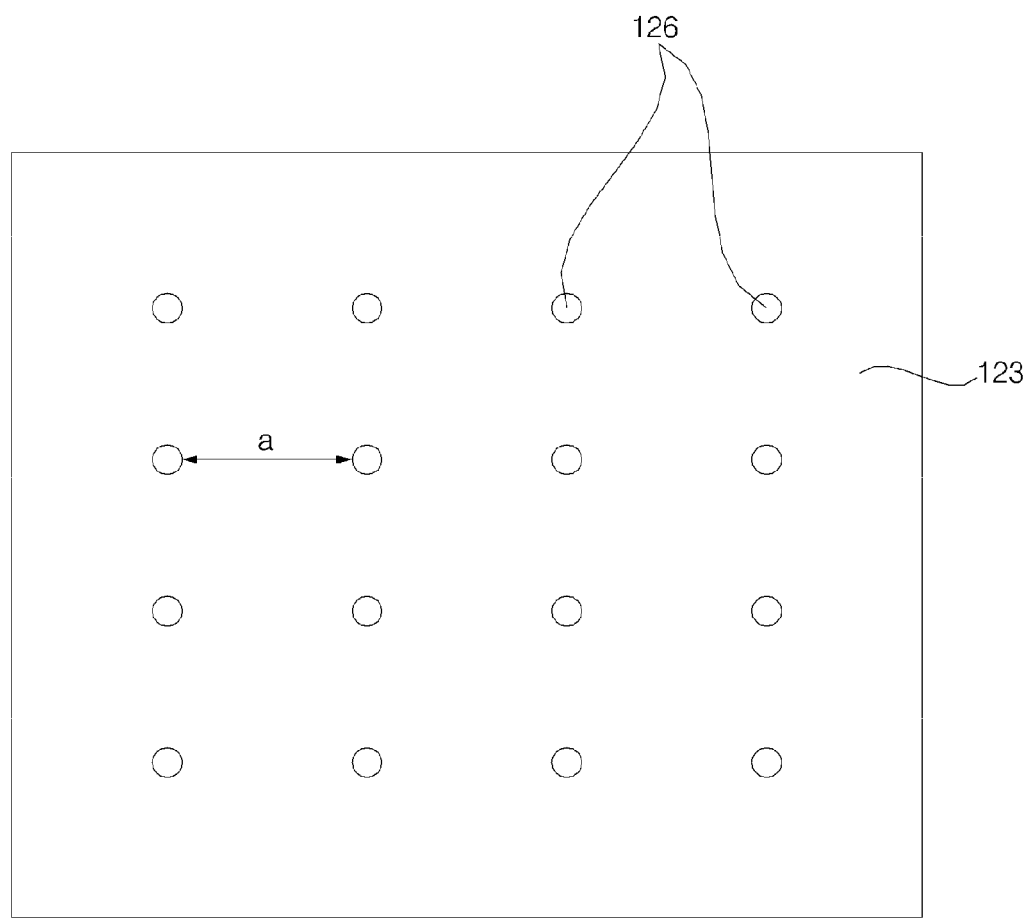
FIG. 2 is a sectional plan view of a first electrode layer taken along the line A-A of FIG. 1.

FIG. 1 is a sectional view illustrating a light emitting device according to an embodiment and FIG. 2 is a sectional plan view of a first electrode layer taken along the line A-A of FIG. 1.

Referring to FIG. 1, the light emitting device 100 according to the present embodiment includes a conductive substrate 110, a first electrode layer 120 disposed on the conductive substrate 110, a light emitting structure 140 including a first semiconductor layer 141, a second semiconductor layer 145 disposed above the first electrode layer 120 and an active layer 143 disposed between the first semiconductor layer 141 and the second semiconductor layer 145, and a second electrode layer 150 electrically connected to the second semiconductor layer 145.

The conductive substrate 110 supports the light emitting structure 140 and the conductive substrate 110 together with the second electrode layer 150 supplies power to the light emitting structure 140. The conductive substrate 110 may be formed of a highly thermal-conductive material or a conductive material, for example, at least one selected from the group consisting of gold (Au), nickel (Ni), tungsten (W), molybdenum (Mo), copper (Cu), aluminum (Al), tantalum (Ta), silver (Ag), platinum (Pt), chromium (Cr), Si, Ge, GaAs, ZnO, GaN, $Ga_2O_3$, SiC, SiGe and CuW, or an alloy of two or more thereof, or a stack of two or more different substances thereof. That is, the conductive substrate 110 may be implemented with a carrier wafer.

The conductive substrate 110 facilitates conduction of heat emitted from the light emitting device 100 and thereby improves thermal stability of the light emitting device 100.

In the present embodiment, the conductive substrate 110 has conductivity. However, the conductive substrate may not have conductivity, but the disclosure is not limited thereto.

The light emitting device includes the first electrode layer 120 to supply power, disposed on the conductive substrate 110. Detailed description of the first electrode layer 120 will be given later.

The light emitting structure 140 includes the first semiconductor layer 141, the second semiconductor layer 145 and the active layer 143 disposed between the first semiconductor layer 141 and the second semiconductor layer 145.

The second semiconductor layer 145 may be an n-type semiconductor layer and the n-type semiconductor layer may be doped with a semiconductor material having a formula of $In_xAl_yGa_{1-x-y}N$ ($0 \leq x \leq 1$, $0 \leq y \leq 1$, $0 \leq x+y \leq 1$) which is for example at least one selected from a group consisting of GaN, AlN, AlGaN, InGaN, InN, InAlGaN and AlInN, or the n-type semiconductor layer may be doped with an n-type dopant such as Si, Ge, Sn, Se or Te. In addition, the second semiconductor layer 145 may be selected from semiconductor materials having a formula of $(Al_xGa_{1-x})_{0.5}In_{0.5}P$.

Meanwhile, the second electrode layer 150 electrically connected to the second semiconductor layer 145 may be disposed on the second semiconductor layer 145 and the second electrode layer 150 may include at least one pad and/or at least one electrode having a predetermined pattern. The second electrode layer 150 may be disposed in central, outside or edge portions of an upper surface of the second semiconductor layer 145, but the disclosure is not limited thereto. The second electrode layer 150 may be disposed in other portions rather than portions of the upper surface of the second semiconductor layer 145, but the disclosure is not limited thereto.

The second electrode layer 150 may be formed as a monolayer or multilayer structure using a conductive material, for example, at least one of metal selected from the group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or an alloy thereof.

A roughness pattern 160 to improve light extraction efficiency may be formed in a part or the entirety of the surface of the second semiconductor layer 145, in which the second electrode layer 150 is not formed, by a predetermined etching method.

In the present embodiment, the second electrode layer 150 is formed on a flat surface on which the roughness pattern 160 is not formed, but the second electrode layer 150 may be formed on the upper surface of the second semiconductor layer 145 in which the roughness pattern 160 is formed, but the disclosure is not limited thereto.

The roughness pattern 160 may be formed by etching at least one portion on the upper surface of the second semiconductor layer 145, but the disclosure is not limited thereto. The etching process includes a wet and/or dry etching process. After the etching process, the upper surface of the second semiconductor layer 145 may have the roughness pattern 160. The roughness pattern 160 having a random size may be irregularly formed and the disclosure is not limited thereto. The roughness pattern 160 is a non-flat surface and includes at least one of a texture pattern, a roughness pattern and an uneven pattern.

A side cross-section of the roughness pattern 160 may be formed to have various shapes, such as cylindrical, polyprism, conical, polypyramidal, circular truncated conical, hexagonal and frusto pyramidal shapes and include a conical or polypyramidal shape.

Meanwhile, the roughness pattern 160 may be formed by a method such as photoelectrochemical (PEC) etching, but the disclosure is not limited thereto. As the roughness pattern 160 is formed on the upper surface of the second semiconductor layer 145, a phenomenon in which light generated by the active layer 143 is total-reflected from the upper surface of the second semiconductor layer 145 and is then re-absorbed or scattered is prevented, thereby contributing to improvement of light extraction efficiency of the light emitting device 100.

The active layer 143 may be disposed under the second semiconductor layer 145. The active layer 143 is an area in which electrons recombine with holes and generate light having a wavelength corresponding to transition to a lower energy level upon recombination therebetween.

The active layer 143 may for example have a single quantum well structure or a multi-quantum well (MQW) structure including a semiconductor material having a formula of $In_xAl_yGa_{1-x-y}N$ ($0 \leq x \leq 1$, $0 \leq y \leq 1$, $0 \leq x+y \leq 1$). In addition, the active layer 143 may be selected from semiconductor materials having a formula of $(Al_xGa_{1-x})_{0.5}In_{0.5}P$.

Accordingly, more electrons are collected to a low energy level of a quantum well layer and, as a result, the probability of recombination of electrons with holes increases and luminous efficacy is thus improved. In addition, the active layer 143 may have a quantum wire structure or a quantum dot structure.

The first semiconductor layer 141 may be formed under the active layer 143. The first semiconductor layer 141 may be implemented with a p-type semiconductor layer and enable injection of holes into the active layer 143. For example, the p-type semiconductor layer may be formed of a semiconductor material having a formula of $In_xAl_yGa_{1-x-y}N$ ($0 \leq x \leq 1$, $0 \leq y \leq 1$, $0 \leq x+y \leq 1$) wherein the semiconductor material is for example at least one selected from a group consisting of GaN, AlN, AlGaN, InGaN, InN, InAlGaN and AlInN, and the p-type semiconductor layer may be doped with a p-type dopant such as Mg, Zn, Ca, Sr or Ba. In addition, the first semiconductor layer 141 may be selected from semiconductor materials having a formula of $(Al_xGa_{1-x})_{0.5}In_{0.5}P$.

In addition, a third semiconductor layer (not shown) may be formed under the first semiconductor layer 141. The third semiconductor layer may be implemented with a semiconductor layer having a polarity opposite to the second semiconductor layer.

Meanwhile, the second semiconductor layer 145, the active layer 143 and the first semiconductor layer 141 may be formed by a method such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and sputtering, but the disclosure is not limited thereto.

In addition, unlike what has been described above, in an embodiment, the second semiconductor layer 145 may be a p-type semiconductor layer and the first semiconductor layer 141 may be an n-type semiconductor layer, but the disclosure is not limited thereto. Accordingly, the light emitting structure 140 may have at least one of N-P, P-N, N-P-N and P-N-P junction structures.

The light emitting structure 140 may further include a window layer 130 to reduce the difference in reflectivity between the first electrode layer 120 and the light emitting structure 140. The window layer 130 may contact the first electrode layer 120.

Specifically, the window layer 130 may be disposed between the first semiconductor layer 141 and a transparent electrode layer 123 of the first electrode layer 120.

The window layer 130 reduces the difference in reflectivity between the light emitting structure 140 and the first electrode layer 120 and thereby improves light extraction efficiency.

The window layer 130 may include at least one of GaP, GaAsP or AlGaAs.

In addition, a passivation 170 may be formed in a part or the entirety of an outer circumferential surface of the light emitting structure 140 to protect the light emitting device from exterior shock and prevent short-circuit.

Referring to FIGS. 1 and 2, the first electrode layer 120 may include a metal or a light-transmitting conductive layer and supply power to the light emitting structure 140. The first electrode layer 120 may be formed of a conductive material, for example, at least one selected from a group consisting of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), indium zinc oxide (IZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), $IrO_x$, $RuO_x$, $RuO_x/ITO$, $Ni/IrO_x/Au$, and $Ni/IrO_x/Au/ITO$, but the disclosure is not limited thereto.

The first electrode layer 120 may include a transparent electrode layer 123, a metal electrode layer 125 and a metal adhesive layer 121.

For example, the first electrode layer 120 may have a structure in which the metal electrode layer 125 and the transparent electrode layer 123 are disposed in this order on the metal adhesive layer 121. In addition, the first electrode layer 120 may further a plurality of contact portions 126 extending from the metal electrode layer 125, passing through the transparent electrode layer 123 and contacting the light emitting structure 140.

The transparent electrode layer 123 may be formed of a light-transmitting and conductive material. For example, the transparent electrode layer 123 may include at least one selected from a group consisting of $In_2O_3$, $SnO_2$, ZnO, ITO, CTO, $CuAlO_2$, $CuGaO_2$ and $SrCu_2O_2$. The transparent electrode layer 123 has areas passing through the contact portions 126.

The metal electrode layer 125 may include a metal material having high conductivity. For example, the metal electrode layer 125 may include at least one selected from a group consisting of Au, a Au alloy (AuBe or AuGe) or a Ag alloy.

The plurality of contact portions 126 are disposed such that they extend from the metal electrode layer 125 and vertically pass through the transparent electrode layer 123. The contact portions 126 may be regularly spaced apart by a predetermined distance. The contact portions 126 contact electrically the light emitting structure 140.

In addition, at least one surface of the contact portions 126 may contact the first semiconductor layer 141 of the light emitting structure 140. As shown in FIG. 1, in a case in which a window layer 130 is formed between the first semiconductor layer 141 and the first electrode layer 120, a surface of the contact portion 126 may contact the window layer 130 (specifically, a lower surface thereof).

A material for the contact portion 126 may be the same as that of the metal electrode layer 125. That is, the contact portion 126 may include a metal material having high conductivity. For example, the contact portion 126 may include at least one of Au, a Au alloy (AuBe or AuGe) or a Ag alloy.

A desired reflectivity can be obtained due to Au alloy without using the metal reflective layer, when the first electrode layer 120 includes the transparent electrode layer 123 and the metal electrode layer 125 having the contact portion 126. In addition, the metal reflective layer is omitted, thus advantageously reducing manufacturing cost and time.

In addition, in the present embodiment, the contact portions 126 are spaced apart from one another, thereby advantageously preventing absorption of light by the contact portions 126 and forming ohmic contact between the contact portions 126 and the light emitting structure 140.

In particular, referring to FIG. 2, a planar area of the transparent electrode layer 123 may be larger than a planar area of the contact portion 126. The planar area of the contact portion 126 may be 10% to 25% with respect to the planar area of the transparent electrode layer 123. When the planar area of the contact portion 126 is less than 10% with respect to the planar area of the transparent electrode layer 123, it is difficult to form the ohmic contact between the light emitting structure 140 and the first electrode layer 120 and, when the planar area of the contact portion 126 is greater than 25% with respect to the planar area of the transparent electrode layer 123, luminous efficacy of the light emitting device 100 is disadvantageously deteriorated due to low light transmittance of the contact portion 126.

For example, the distance between adjacent contact portions 126 is 35 μm to 50 μm and a width of the contact portions 126 is 10 μm to 20 μm so as to adjust the planar area of the contact portion 126 to 10% to 25% with respect to the planar area of the transparent electrode layer 123.

The contact portions 126 may have a rod shape, but the disclosure is not limited thereto. Preferably, the contact portions may have a cylindrical or polyprism shape.

The first electrode layer 120 may be flat, as shown in FIG. 1, but the disclosure is not limited thereto. The first electrode layer 120 may have a step.

The first electrode layer 120 may further include a metal adhesive layer 121.

The metal adhesive layer 121 is formed under the metal electrode layer 125 and reinforces adhesion between the layers. The metal adhesive layer 121 may be formed of a material having superior adhesion to lower materials. For example, the metal adhesive layer 121 may include at least one selected from a group consisting of a PbSn alloy, a AuGe alloy, a AuBe alloy, a AuSn alloy, Sn, In, a SnIn alloy or a PdIn alloy. In addition, an anti-diffusion film (not shown) may be further formed above the metal adhesive layer 121. The anti-diffusion film prevents materials for the conductive substrate 110 and the metal adhesive layer 121 from diffusing to the light emitting structure 140. The anti-diffusion film may be formed of a material preventing diffusion of metals and the material for example includes at least one selected from a group consisting of platinum (Pt), palladium (Pd), tungsten (W), nickel (Ni), ruthenium (Ru), molybdenum (Mo), iridium (Ir), rhodium (Rh), tantalum (Ta), hafnium (Hf), zirconium (Zr), niobium (Nb) and vanadium (V), and alloys of two or more thereof, but the disclosure is not limited thereto. The metal adhesive layer 121 may have a mono or multi-layer structure.

Figure 3:
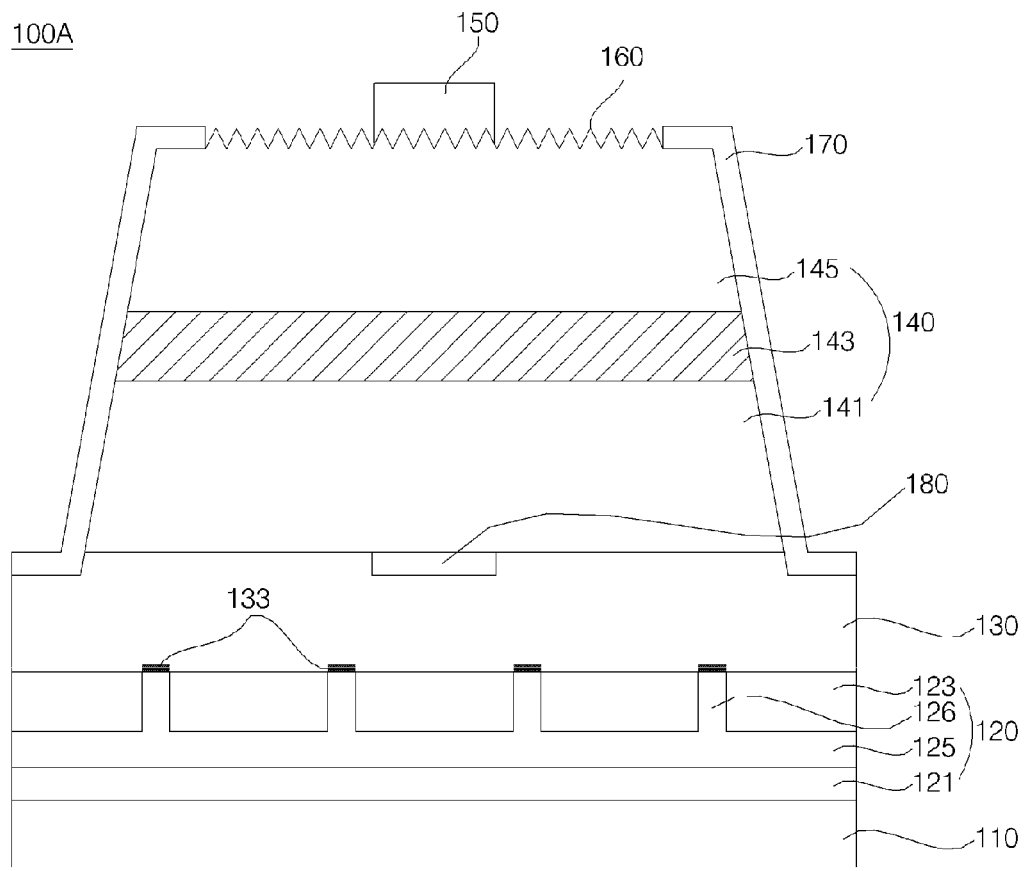
FIG. 3 is a sectional view illustrating a light emitting device according to another embodiment.

FIG. 3 is a sectional view illustrating a light emitting device according to another embodiment.

Referring to FIG. 3, the light emitting device 100A may further include a current blocking layer 180 and a diffusion area 133, when compared to the embodiment shown in FIG. 1.

The diffusion area 133 may be formed by diffusing Be on a surface of the light emitting structure 140. That is, the diffusion area 133 may be formed on the surface of the light emitting structure 140 using a mixture of Be with at least part of elements of a material for the light emitting structure 140.

The diffusion area 133 may be formed at least in an area in which the light emitting structure 140 contacts the contact portion 126. A size of the diffusion area 133 may be greater than the area in which the light emitting structure 140 contacts the contact portion 126.

Specifically, the diffusion area 133 may be formed on a lower surface of the first semiconductor layer 141. In addition, when the light emitting structure 140 includes the window layer 130, the diffusion area 133 may be formed on the lower surface of the window layer 130.

A diffusion method of the diffusion area 133 is not limited. The diffusion method may include depositing a Be-containing material (for example, AuBe) on the diffusion area 133, performing an alloying process and removing the Be-containing material.

A plurality of diffusion areas 133 including the diffusion area 133 may be spaced from one another in the light emitting structure 140 such that they form a dot or island pattern. The diffusion areas 133 are disposed such that they correspond to the contact portions 126.

The diffusion areas 133 may be formed to a predetermined depth from the surface of the light emitting structure 140. In addition, the diffusion areas 133 may protrude from the surface of the light emitting structure 140.

When the diffusion areas 133 are formed in the light emitting structure 140 and the contact portions 126 are connected to the diffusion areas 133, ohmic-contact between the light emitting structure 140 and the contact portions 126 is improved due to the diffusion areas 133. In addition, in the present embodiment, the contact electrode is omitted, thus preventing absorption of light by the contact electrode and thus improving luminous efficacy of the light emitting device.

In addition, the metal electrode layer 125 is directly connected to the light emitting structure 140, thus advantageously reducing VF and improving luminous efficacy.

The current blocking layer 180 may be disposed under the light emitting structure 140 such that a portion of the current blocking layer 180 overlaps the second electrode layer 150 in a vertical direction and have lower electrical conductivity than the metal electrode layer 125. The current blocking layer 180 may for example include at least one selected from a group consisting of aluminum oxide ($Al_2O_3$) silicon oxide ($SiO_2$), silicon nitride ($Si_3N_4$), titanium oxide ($TiO_x$), indium tin oxide (ITO), aluminum zinc oxide (AZO) and indium zinc oxide (IZO), but the disclosure is not limited thereto.

The current blocking layer 180 may be an electron blocking layer which prevents a phenomenon in which, upon application of high current, electrons injected into the active layer 143 from the second semiconductor layer 145 are not recombined with holes in the active layer 143 and enter the first electrode layer 120. The current blocking layer 180 has a larger band gap than the active layer 143, thereby preventing the phenomenon in which electrons injected into the active layer 143 from the second semiconductor layer 145 are not recombined in the active layer 143 and enter the first electrode layer 120. As a result, the probability of recombination of electrons with holes in the active layer 143 is increased and leakage current is prevented.

Figure 4:
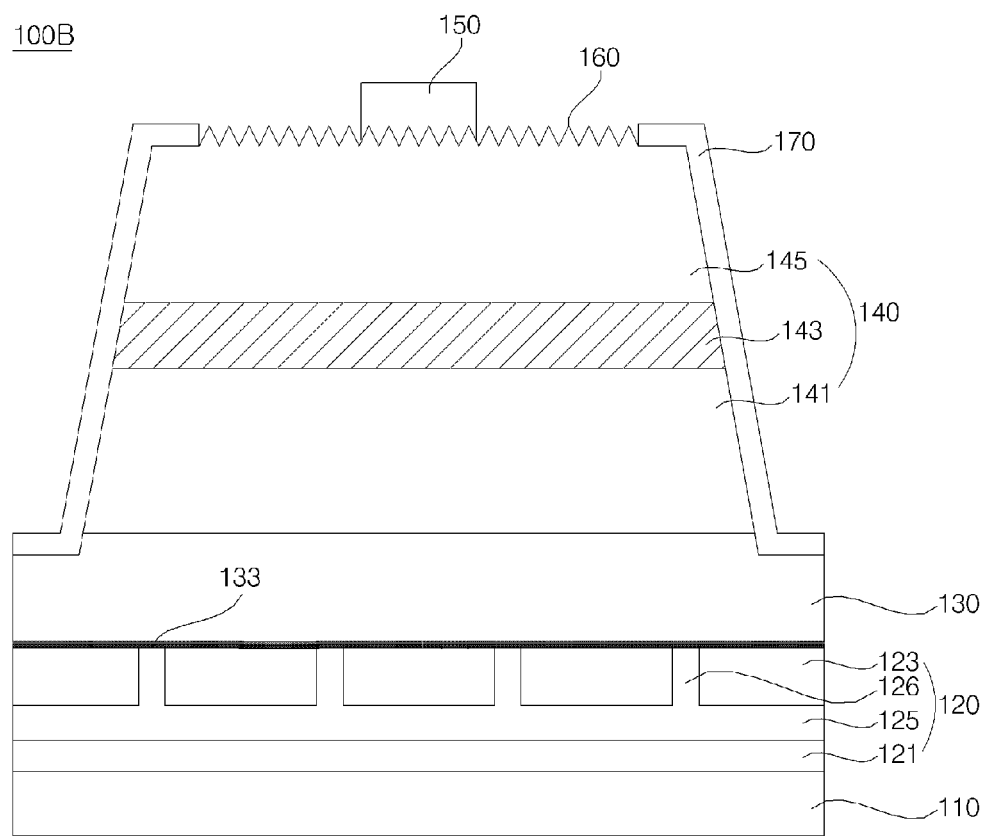
FIG. 4 is a sectional view illustrating a light emitting device according to another embodiment.

FIG. 4 is a sectional view illustrating a light emitting device according to another embodiment.

Referring to FIG. 4, the light emitting device 100B according to the present embodiment is different from the embodiment shown in FIG. 3 in view of position of the diffusion area 133 and omission of the current blocking layer 170.

The diffusion area 133 may contact the transparent electrode layer 123 and the contact portion 126, as shown in FIG. 4.

Specifically, the diffusion area 133 may be formed in the entirety of the lower surface of the first semiconductor layer 141, when the window layer 130 is omitted.

The diffusion area 133 may be disposed so as to contact the transparent electrode layer 123 and the contact portion 126.

Figure 5:
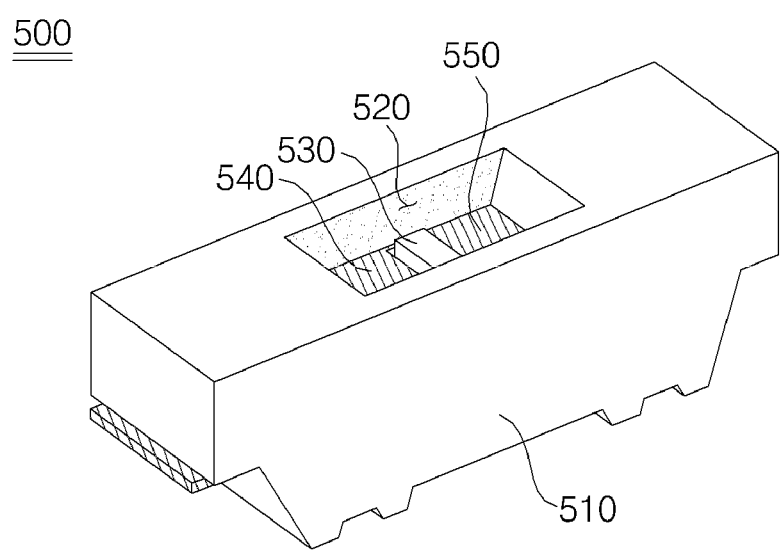
FIG. 5 is a perspective view illustrating a light emitting device package including a light emitting device according to an embodiment.
Figure 6:
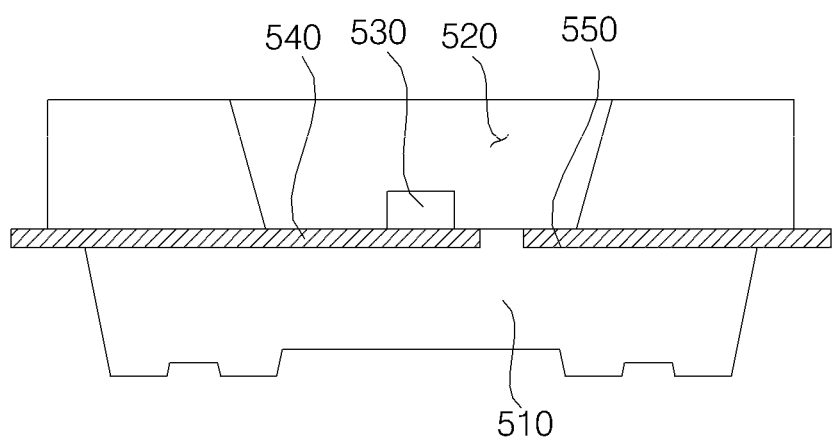
FIG. 6 is a sectional view illustrating the light emitting device package including the light emitting device according to the present embodiment.

FIG. 5 is a perspective view illustrating a light emitting device package including a light emitting device according to an embodiment and FIG. 6 is a sectional view illustrating a light emitting device package including the light emitting device according to the present embodiment.

Referring to FIGS. 5 and 6, a light emitting device package 500 includes a body 510 provided with a cavity 520, first and second lead frames 540 and 550 mounted on the body 510, a light emitting device 530 electrically connected to the first and second lead frames 540 and 550, and a sealant (not shown) filling the cavity 520 to cover the light emitting device 530.

The body 510 may be composed of at least one selected from resin materials such as polyphthalamide (PPA), silicon (Si), aluminum (Al), aluminum nitride (AlN), photosensitive glass (PSG), polyamide9T (PA9T), syndiotactic polystyrene (SPS), metal materials, sapphire ($Al_2O_3$), beryllium oxide (BeO) and printed circuit boards (PCB). The body 510 may be formed by a process such as injection molding and etching, but the disclosure is not limited thereto.

The inner surface of the body 510 may be provided with an inclined surface. A reflective angle of light emitted from the light emitting device 530 may be changed depending on an angle of the inclined surface. Accordingly, the orientation angle of light discharged to the outside can be controlled.

As the orientation angle of light decreases, convergence of light emitted from the light emitting device 530 to the outside increases. On the other hand, as the orientation angle of light increases, convergence of light from the light emitting device 530 to the outside decreases.

Meanwhile, as seen from above, the cavity 520 provided in the body 510 may have various shapes including, but not limited to, a circular shape, a rectangular shape, a polygonal shape, an oval shape and a shape with curved corners.

The light emitting device 530 is mounted on the first lead frame 540 and examples thereof include, but are not limited to, light emitting devices emitting red, green, blue or white light, and light emitting devices emitting ultraviolet light. Further, one or more light emitting devices 530 including the light emitting device 530 may be mounted on the first lead frame 540.

Further, the light emitting device 530 may be applied to all of a horizontal light emitting device, in which all electrical terminals thereof are formed on the upper surface, a vertical light emitting device, in which electrical terminals thereof are formed on the upper or lower surface, and a flip chip light emitting device.

The cavity 520 is filled with the sealant (not shown) such that the sealant covers the light emitting device 530.

The sealant (not shown) may be composed of silicone, epoxy or other resin material and may be formed by filling the cavity 520 with a sealant, followed by UV or heat curing.

In addition, the sealant (not shown) may include a phosphor, and a type of the phosphor is selected in consideration of the wavelength of light emitted from the light emitting device 530 to enable the light emitting device package 500 to produce white light.

According to wavelength of light emitted from the light emitting device 530, the phosphor may include at least one of a blue light emitting phosphor, a blue-green light emitting phosphor, a green light emitting phosphor, a yellowish green light emitting phosphor, a yellow light emitting phosphor, a yellowish red light emitting phosphor, an orange light emitting phosphor and a red light emitting phosphor.

That is, the phosphor is excited by first light emitted from the light emitting device 530 to produce second light. For example, in a case where the light emitting device 530 is a blue light emitting diode and the phosphor is a yellow phosphor, the yellow phosphor is excited by blue light to emit yellow light, blue light emitted from the blue light emitting diode is mixed with yellow light excited and generated by blue light to enable the light emitting device package 500 to produce white light.

Similarly, in the case where the light emitting device 530 is a green light emitting diode, a magenta phosphor or a combination of blue and red phosphors may be used, and in the case where the light emitting device 530 is a red light emitting diode, a cyan phosphor or a combination of blue and green phosphors may be used.

Such a phosphor may be selected from known phosphors such as YAG, TAG, sulfides, silicates, aluminates, nitrides, carbides, nitridosililcates, borates, fluorides and phosphates.

The first and second lead frames 540 and 550 may include a metal material selected from titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 540 and 550 may have a monolayer or multilayer structure, but are not limited thereto.

The first and second lead frames 540 and 550 are spaced from and electrically separated from each other. The light emitting device 530 is mounted on the first and second lead frames 540 and 550, and the first and second lead frames 540 and 550 directly contact the light emitting device 530, or are electrically connected thereto through a conductive material such as a soldering member (not shown). In addition, the light emitting device 530 may be electrically connected to the first and second lead frames 540 and 550 via wire bonding, although the present invention is not limited thereto. Accordingly, when a power supply is connected to the first and second lead frames 540 and 550, power may be supplied to the light emitting device 530. Meanwhile, plural lead frames (not shown) are mounted in the body 510 and respective lead frames (not shown) are electrically connected to the light emitting device 530, although the disclosure is not limited thereto.

Figure 7:
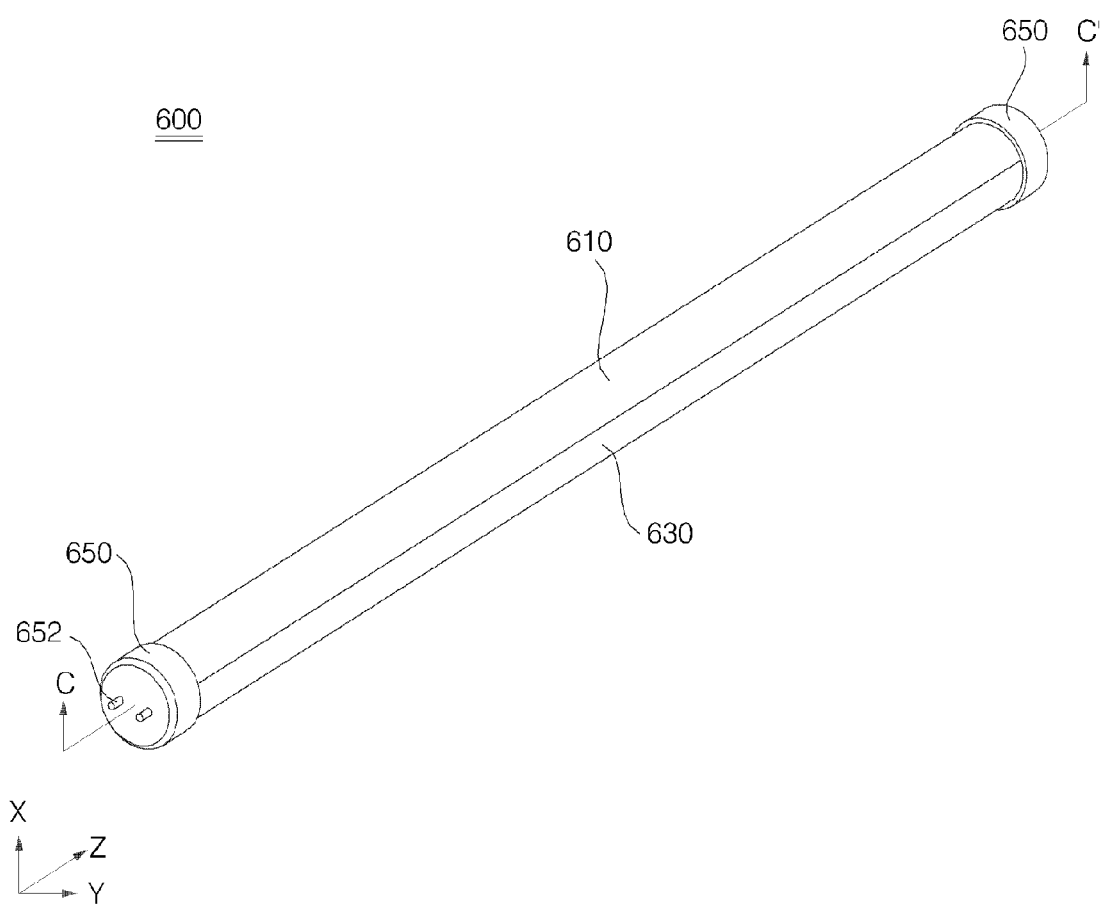
FIG. 7 is an exploded perspective view illustrating a lighting system including a light emitting device according to an embodiment.
Figure 8:
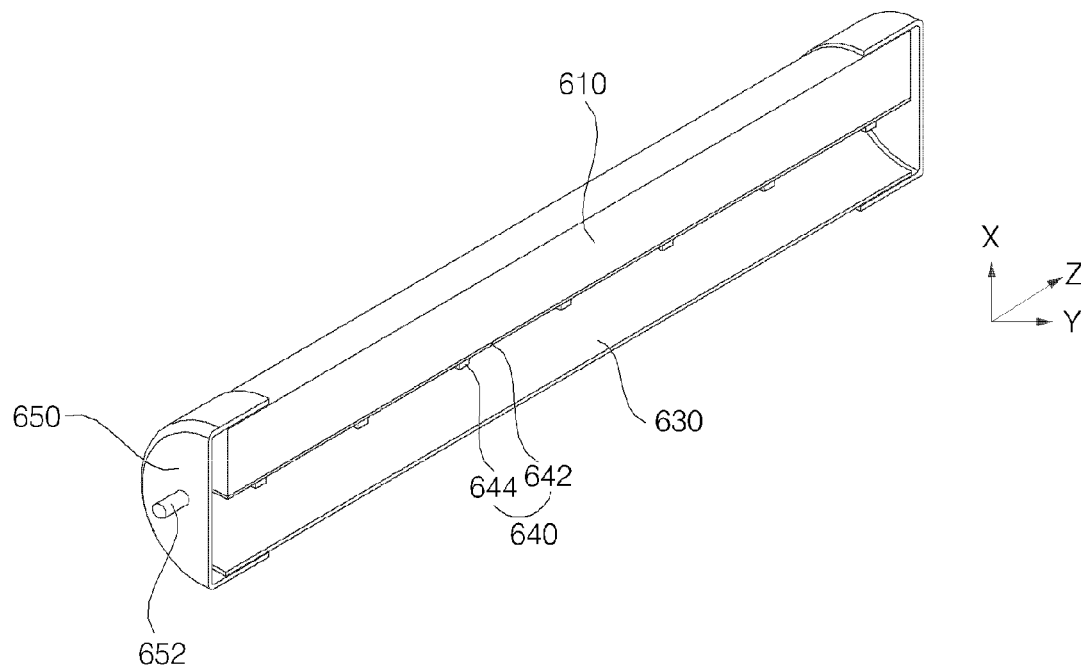
FIG. 8 is a sectional view illustrating a cross-section C-C' of the lighting system of FIG. 7.

FIG. 7 is a perspective view illustrating a lighting system including the light emitting device according to an embodiment. FIG. 8 is a sectional view illustrating a cross-section C-C' of the lighting system of FIG. 7.

Referring to FIGS. 7 and 8, the lighting device 600 may include a body 610, a cover 630 connected to the body 610 and an end cap 650 disposed at both ends of the body 610.

A light emitting device module 640 is connected to the bottom of the body 610 and the body 610 may be composed of a metal material which exhibits superior conductivity and heat emission effects in order to discharge heat generated from the light emitting device package 644 to the outside through the top of the body 610.

The light emitting device packages 644 having multiple colors are mounted on the PCB 642 in multiple rows to constitute an array, and may be mounted thereon such that they are spaced from one another by a predetermined distance or by different distances, as necessary, to control brightness. The PCB 642 may be a metal core PCB (MPPCB) or PCB made of FR4.

The light emitting device package 644 includes an extended lead frame (not shown) to improve heat radiation, thereby enhancing reliability and efficiency of the light emitting device packages 644, and lengthening lifespan of the light emitting device package 644 and the lighting device 600 including the light emitting device package 644.

The cover 630 may take the shape of a circle such that it surrounds the bottom of the body 610, but the disclosure is not limited thereto.

The cover 630 protects the light emitting device module 640 disposed therein from exterior foreign substances. In addition, the cover 630 prevents glare generated by the light emitting device package 644 and includes diffusion particles to uniformly discharge light to the outside. In addition, a prism pattern or the like may be formed on at least one of the inner and outer surfaces of the cover 630. Alternatively, a phosphor may be applied onto at least one of the inner and outer surfaces of the cover 630.

Meanwhile, the cover 630 should exhibit superior light transmittance because light generated from the light emitting device package 644 is discharged to the outside through the cover 630, and the cover 630 should exhibit sufficient heat resistance in order to endure heat generated by the light emitting device package 644. Preferably, the cover 630 is composed of a material including polyethylene terephthalate (PET), polycarbonate (PC) or polymethyl methacrylate (PMMA) and the like.

The end cap 650 is disposed on both ends of the body 610 and may be used to seal a power device (not shown). In addition, the end cap 650 is provided with a power pin 652, allowing the lighting device 600 to be applied to a conventional terminal from which a fluorescent light has been removed, without using any additional device.

Figure 9:
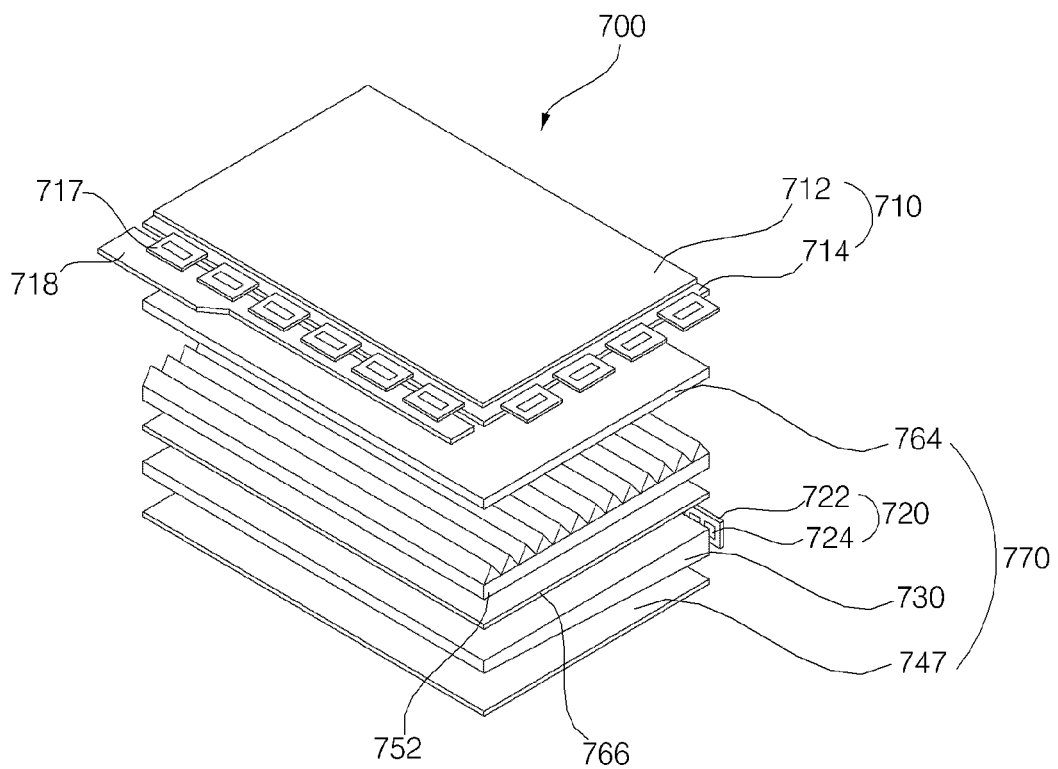
FIG. 9 is an exploded perspective view illustrating a liquid crystal device including a light emitting device according one embodiment.

FIG. 9 is an exploded perspective view illustrating a liquid crystal display including a light emitting device according to one embodiment.

FIG. 9 illustrates an edge-light type liquid crystal display device 700 which includes a liquid crystal display panel 710 and a backlight unit 770 to supply light to the liquid crystal display panel 710.

The liquid crystal display panel 710 displays an image using light supplied from the backlight unit 770. The liquid crystal display panel 710 includes a color filter substrate 712 and a thin film transistor substrate 714 which face each other via a liquid crystal disposed therebetween.

The color filter substrate 712 can realize color of images to be displayed through the liquid crystal display panel 710.

The thin film transistor substrate 714 is electrically connected to printed circuit board 718, on which a plurality of circuit components are mounted, through a driving film 717. The thin film transistor substrate 714 may apply drive voltage supplied from the printed circuit board 718 to the liquid crystal in response to drive signals supplied from the printed circuit board 718.

The thin film transistor substrate 714 includes a thin film transistor and a pixel electrode formed as a thin film on another substrate composed of a transparent material such as glass or plastic.

The backlight unit 770 includes a light emitting device module 720 to emit light, a light guide plate 730 to convert light emitted from the light emitting device module 720 into a surface light source and supply the light to the liquid crystal display panel 710, a plurality of films 750, 766 and 764 to uniformize brightness of light from the light guide plate 730 and improve vertical incidence, and a reflective sheet 740 to reflect light emitted backward the light guide plate 730 to the light guide plate 730.

The light emitting device module 720 includes a plurality of light emitting device packages 724 and a PCB 722 on which the light emitting device packages 724 are mounted to form an array. In this case, reliability of mounting of the bent light emitting device packages 724 can be improved.

Meanwhile, the backlight unit 770 includes a diffusion film 766 to diffuse light incident from the light guide plate 730 toward the liquid crystal display panel 710, a prism film 752 to collect the diffused light and thus improve vertical incidence and a protective film 764 to protect the prism film 752.

Figure 10:
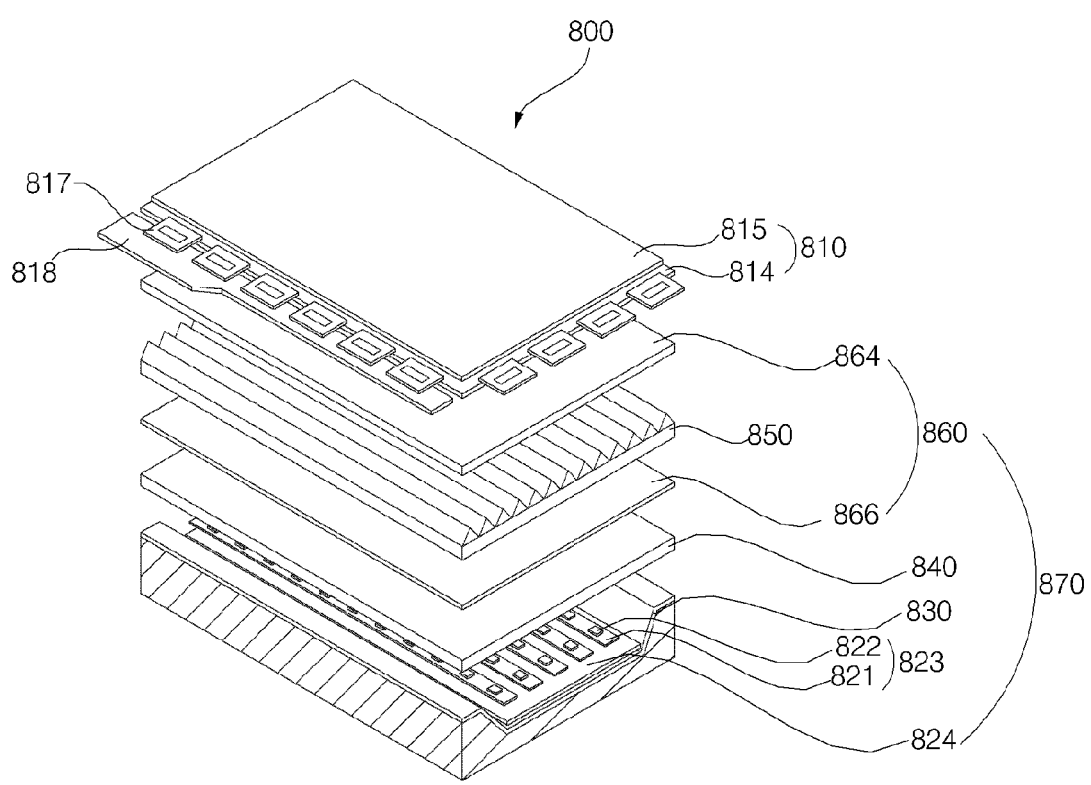
FIG. 10 is an exploded perspective view illustrating a liquid crystal device including a light emitting device according another embodiment.

FIG. 10 is an exploded perspective view illustrating a liquid crystal display including a light emitting device according to an embodiment. Contents illustrated and described in FIG. 9 are not mentioned in detail.

FIG. 10 illustrates a direct-type liquid crystal display device 800 which includes a liquid crystal display panel 810 and a backlight unit 870 to supply light to the liquid crystal display panel 810.

The liquid crystal display panel 810 is described in FIG. 9 and a detailed explanation thereof is omitted.

The backlight unit 870 includes a plurality of light emitting device modules 823, a reflective sheet 824, a lower chassis 830 in which the light emitting device modules 823 and the reflective sheet 824 are accepted, a diffusion plate 840 disposed on the light emitting device modules 823, and a plurality of optical films 860.

Each light emitting device module 823 includes a plurality of light emitting device packages 822 and a PCB 821 on which the light emitting device packages 822 are mounted to form an array. The reflective sheet 824 reflects light generated by the light emitting device package 822 toward the liquid crystal display panel 810 to improve luminous efficacy.

Meanwhile, light generated by the light emitting device module 823 is incident on the diffusion plate 840 and an optical film 860 is disposed on the diffusion plate 840. The optical film 860 includes a diffusion film 866, a prism film 850 and a protective film 864.

As apparent from the fore-going, in accordance with the light emitting device according to the embodiments, the contact portion is disposed so as to pass through the transparent electrode layer and thus advantageously easily contacts electrically the light emitting structure.

In addition, the contact portion passes through the transparent electrode layer, thus advantageously enabling heat generated by the light emitting structure to be readily discharged to the conductive substrate.

In addition, the contact portion directly contacts the light emitting structure, thus advantageously reducing forward voltage (VF).

In addition, a metal reflective layer is omitted, thus advantageously reducing manufacturing cost of the metal reflective layer.

In addition, the contact portions are spaced from one another and thus advantageously contact electrically the light emitting structure while preventing absorption of light by the contact portions.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer,
wherein the first electrode layer comprises:
a metal electrode layer disposed on the conductive substrate;
a transparent electrode layer disposed on the metal electrode layer; and
a plurality of contact portions extending from the metal electrode layer, the contact portions vertically passing through the transparent electrode layer and contacting the light emitting structure,
wherein the contact portions are spaced from one another by a predetermined distance, and
wherein the contact portion comprises AuBe.

2. The light emitting device according to claim 1, wherein the transparent electrode layer comprises at least one of $In_2O_3$, $SnO_2$, ZnO, ITO, CTO, $CuAlO_2$, $CuGaO_2$ and $SrCu_2O_2$.

3. The light emitting device according to claim 1, wherein a planar area of the transparent electrode layer is greater than a planar area of the contact portion.

4. The light emitting device according to claim 1, wherein a material for the metal electrode layer is the same as a material for the contact portion.

5. A light emitting device comprising:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer,
wherein the first electrode layer comprises:
a metal electrode layer disposed on the conductive substrate;
a transparent electrode layer disposed on the metal electrode layer; and
a plurality of contact portions extending from the metal electrode layer, the contact portions vertically passing through the transparent electrode layer and contacting the light emitting structure,
wherein the contact portions are spaced from one another by a predetermined distance, and
wherein the light emitting structure further comprises a window layer contacting the first electrode layer.

6. The light emitting device according to claim 1, wherein the light emitting structure comprises AlGaInP or GaInP.

7. The light emitting device according to claim 5, wherein the contact portion comprises AuBe, Ag or a Ag alloy.

8. The light emitting device according to claim 5, wherein the window layer comprises GaP, GaAsP or AlGaAs.

9. The light emitting device according to claim 5, wherein the contact portion contacts a lower surface of the window layer.

10. A light emitting device comprising:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer,
wherein the first electrode layer comprises:
a metal electrode layer disposed on the conductive substrate;
a transparent electrode layer disposed on the metal electrode layer; and
a plurality of contact portions extending from the metal electrode layer, the contact portions vertically passing through the transparent electrode layer and contacting the light emitting structure,
wherein the contact portions are spaced from one another by a predetermined distance, and
a diffusion area containing Be is formed in a portion of the light emitting structure contacting the contact portion.

11. The light emitting device according to claim 10, wherein the transparent electrode layer comprises at least one of $In_2O_3$, $SnO_2$, ZnO, ITO, CTO, $CuAlO_2$, $CuGaO_2$ and $SrCu_2O_2$.

12. The light emitting device according to claim 10, wherein a planar area of the transparent electrode layer is greater than a planar area of the contact portion.

13. The light emitting device according to claim 10, wherein a material for the metal electrode layer is the same as a material for the contact portion.

14. The light emitting device according to claim 10, wherein the light emitting structure further comprises a window layer contacting the first electrode layer.

15. The light emitting device according to claim 14, wherein the window layer comprises GaP, GaAsP or AlGaAs.

16. The light emitting device according to claim 14, wherein the contact portion contacts a lower surface of the window layer.

17. The light emitting device according to claim 10, wherein the diffusion area is formed in the light emitting structure using a mixture of Be and at least part of elements of a material constituting the light emitting structure.

18. The light emitting device according to claim 10, wherein the diffusion area protrudes from the light emitting structure.

19. The light emitting device according to claim 10, wherein the light emitting structure comprises AlGaInP or GaInP.

20. A light emitting device package comprising a light emitting device, wherein the light emitting device comprises:
a conductive substrate;
a first electrode layer disposed on the conductive substrate;
a light emitting structure disposed on the first electrode layer, the light emitting structure including a first semiconductor layer, a second semiconductor layer, and an active layer disposed between the first semiconductor layer and the second semiconductor layer; and
a second electrode layer electrically connected to the second semiconductor layer, wherein the first electrode layer comprises:
- a metal electrode layer disposed on the conductive substrate;
- a transparent electrode layer disposed on the metal electrode layer; and
- a plurality of contact portions extending from the metal electrode layer, the contact portions vertically passing through the transparent electrode layer and contacting the light emitting structure,
- wherein the contact portions are spaced from one another by a predetermined distance, and
- a diffusion area containing Be is formed in a portion of the light emitting structure contacting the contact portion.

* * * * *